United States Patent [19]

Blish, II et al.

[11] 4,040,897
[45] Aug. 9, 1977

[54] ETCHANTS FOR GLASS FILMS ON METAL SUBSTRATES

[75] Inventors: Richard C. Blish, II; Kyle Eugene Lemons, both of San Jose, Calif.

[73] Assignee: Signetics Corporation, Sunnyvale, Calif.

[21] Appl. No.: 740,546

[22] Filed: Nov. 10, 1976

Related U.S. Application Data

[63] Continuation of Ser. No. 574,503, May 5, 1975, abandoned.

[51] Int. Cl.$^2$ ............................................. H01L 21/312
[52] U.S. Cl. ......................................... 156/656; 65/31; 134/3; 156/657; 156/663; 252/79.3; 252/79.4
[58] Field of Search ..................... 252/79.3, 79.4, 142; 156/654, 656, 657, 663; 65/31; 134/3

[56] References Cited

U.S. PATENT DOCUMENTS

| | | | |
|---|---|---|---|
| 3,616,098 | 10/1971 | Falls | 156/663 |
| 3,642,549 | 2/1972 | Couture et al. | 156/663 |
| 3,715,250 | 2/1973 | Altman et al. | 156/656 |

*Primary Examiner*—Charles E. Van Horn
*Assistant Examiner*—Jerome W. Massie
*Attorney, Agent, or Firm*—Flehr, Hohbach, Test, Albritton & Herbert

[57] ABSTRACT

An aqueous solution for etching a glass layer on a metal (aluminum) substrate without substantial attack on the metal. The solution comprises buffered hydrofluoric acid, sodium chloride, and either (a) a fluorocarbon surfactant capable of forming a protective thin film upon the aluminum, or (b) a 6-hydroxy alcohol (e.g., mannitol or sorbitol).

7 Claims, No Drawings

ETCHANTS FOR GLASS FILMS ON METAL SUBSTRATES

This is a continuation, of application Ser. no. 574,503 filed May 5, 1975, now abandoned.

BACKGROUND OF THE INVENTION

It is conventional to etch glass with an aqueous solution of hydrofluoric acid buffered with ammonium flouride. However, this etching solution cannot be employed to etch a glass layer on an aluminum or other metal substrate, such as employed in wafers in the semiconductor industry because the etchant has a tendency to attack the aluminum once it has etched through the glass via.

In an article by D. S. Herman et al, entitled "Multi-Layer Metalization Process CMOS FET Devices" at page 168 of the Electro-Chemical Society Extended Abstracts from the Spring meeting in Washington, D.C., May, 1971, it is stated that the addition of a diol alcohol to the buffered hydrofluoric acid inhibits the aluminum attack. We have determined that a suitable quantity of diol alcohol (ethylene glycol) for this purpose is on the order of 50% of the etching solution. A typical formulation which has been found to be acceptable was 5 parts of buffered oxide etch (34 parts by weight of 40% aqueous ammonium fluoride, plus 5 parts of hydrofluoric acid (49% aqueous)), 5 parts of ethylene glycol and 3 parts of water. One purpose of the 3 parts extra water is to prevent precipitation of ammonium fluoride or complex double salts with silicon fluoride on the semiconductor wafers.

Since the above glycol-containing etchant solution is nearly saturated, it has a high viscosity which renders it difficult to rinse off and to etch small openings in a photoresist. Also, the mixture tends to corrode the aluminum intermittently. Additionally, ethylene glycol has become in scarce supply and is significantly more expensive due to shortages in the petrochemical industry.

SUMMARY OF THE INVENTION AND OBJECTS

It is an object of the invention to provide an etching solution capable of etching glass (amorphous $SiO_2$ films) on an aluminum or other metal substrate which is more economical than etching solutions of the prior art.

It is another object of the invention to provide an etching solution of the foregoing type with improved etching qualities and protection of the metal in comparison to that of the prior art.

Other objects of the invention will be apparent from the following description in which the preferred embodiments have been set forth.

In accordance with the above objects, an etching composition and method has been provided particularly adapted for etching glass on an aluminum or other metal substrate. The etching portion of the solution is a conventional buffered hydrofluoric acid. Another component, sodium chloride, is believed to complex with excess water to lower the activity of the water in the presence of the hydrofluoric acid with respect to attacking the aluminum. In one embodiment, the etching solution also includes a fluorocarbon surfactant which is capable of forming a thin film upon the aluminum substrate, for protection against attack after the glass has been etched. In another embodiment, the surfactant is replaced with a small quantity of a 6-hydroxy alcohol with a similar protective effect. Either of the above systems are relatively inexpensive, have a high specific activity for pyrolytic glass in comparison to aluminum. They also provide a constant etch rate over a wide variety of dilutions, and avoid problems of precipitation by nearly saturated solutions since they can be diluted well below saturation.

DETAILED DESCRIPTION OF THE PREFERRED EMBODIMENTS

An aqueous etching solution of the present invention is particularly suited to the etching of a pyrolytic glass layer on an aluminum substrate without attacking the aluminum. The basic composition includes a conventional buffered hydrofluoric acid, sodium chloride, and a third component, either a surfactant or a 6-hydroxy alcohol. The invention will be first described with respect to the surfactant-containing embodiment.

A conventional "buffered oxide etch" (BOE) is employed as the etching portion of the aqueous solution. A suitable BOE includes 34 parts by weight of a 40% aqueous ammonium fluoride solution and 5 parts by weight of a 49% hydrofluoric acid solution. Other buffered hydrofluoric acid solutions may be employed within this scope of the invention. The high degree of aqueous dilution which can be accomplished without attacking the aluminum is a major advantage of the invention. Aqueous dilution is defined as the ratio by volume of the BOE to the remainder of the water in the etchant solution.

The sodium chloride component serves to tie up or complex with the water to permit a high degree of dilution without aluminum attack when used in conjunction with the present surfactant or 6-hydroxy alcohol. In addition, the sodium chloride has been found to stabilize the etching rate over a wide range of dilutions. Other alkali halide salts may be employed for this purpose (e.g., potassium bromide). However, it has been discovered that substantially higher amounts of such other salts are required to complex with the water to the desired extent for aluminum protection. For optimum aluminum protection, the sodium chloride content is just below saturation, to the point where it begins to precipitate.

For a dilution of 1 part BOE to 4 parts of water, a sodium chloride concentration of about 1 to 3% by weight has been found sufficient to complex with the water to the desired extent for aluminum protection. For the surfactant embodiment, it ha been found that an optimum sodium chloride concentration is on the order of 1.3 to 2.3% by weight while for the 6-hydroxy alcohol component, an optimum concentration is on the order of 2% by weight.

In the surfactant-containing etching solution, a suitable surfactant should be employed which does not interfere with etching of a glass layer but which is capable of forming a thin film upon an aluminum substrate to protect the aluminum from attack by hydrofluoric acid. A fluorocarbon surfactant has been found to be particularly effective in the presence of the sodium chloride without the requirement for an organic solvent. One effective surfactant for this purpose is sold under the designation "Fluorocarbon No. 134" by 3M Company. It is a cationic brown waxy solid material which adsorbs upon metals, specifically aluminum. The hydrophilic end of the surfactant adsorbs upon the aluminum while the hydrophobic end projects into the etching solution and protects the aluminum from the hydrofluoric acid.

Only a relatively small concentration of the fluorocarbon as surfactant is required to protect the aluminum in the presence of sodium chloride. This indicates that the surfactant forms a very thin almost monomolecular layer on the aluminum. Concentrations of Fluorocarbon No. 134 on the order of 2 to 1000 parts per million and preferably 500 parts per million, serve to provide the desired degree of protection.

Etching solutions which include BOE, sodium chloride, and fluorocarbon surfactant have been found to be highly insensitive to the degree of dilution in water. Thus, dilutions from 1 part of BOE to 1 part of water to as high as 30 parts of water does not significantly effect the etch rate. Expressed in a different manner, the etching rate on pyrolytic glass does not change when the hydrofluoric acid concentration varies from 0.2% to as high as 6% by weight of the composition. However, the etch rate on dense thermal oxides is directly proportional to hydrofluoric acid concentrations over this range. Accordingly, the more dilute solutions are highly selective with respect to pyrolytic glass and are must less active with respect to thermal oxides.

In an alternative embodiment to the surfactant-containing solution of the present invention, it has been found that the surfactant may be replaced with a 6-hydroxy alcohol while providing protection for the aluminum.

It has been found that a suitable composition includes a dilution of 1 part BOE to 4 parts water together with 2% sodium chloride and 3% mannitol or 4% sorbitol.

The above etching solutions are effective for etching pyrolytic glass, commonly phosphosilicate. Such glass is particularly useful in the fabrication of integrated circuit wafers, namely for scratch protection, or as a dialectic separation from another conductor such as aluminum, doped polycrystalline silicon, or other metals and alloys. After deposition, the glass may be delineated into patterns by a masking process to permit appropriate contacts. Thus, the etchants must etch the silica-containing glass but not lift off the photo-resist mask or harm the underlying layer. The etchant of the present invention is suitable for etching any pyrolytic glass, e.g., boron, phosphorous, or arsenic, doped or undoped glasses, so long as the glass is not fully densified (e.g., a thermal oxide). Such glasses are relatively porous and so are more readily etched than such thermal oxides.

A method for carrying out the above process is as follows. An aqueous solution is formed comprising one part by volume of BOE and 4 parts by volume of water. The BOE is the same composition set forth above. In one method, 2% sodium chloride and 500 parts per million of surfactant (3M brand designation "Fluorocarbon No. 134") are added to this mixture. Pyrolytic glass coated aluminum substrates are continuously dipped into this solution during the course of an eight-hour shift. It is found that the etch rate is nearly constant during this period of time with a normal flux of wafers. The etch rate does not begin to fall off until the etching capacity (i.e., hydrofluoric acid) is reduced to on the order of 30% of the initial value set forth above.

The above procedure is repeated in two additional runs; one in which 3% by weight of mannitol is substituted for the surfactant; and the other in which 4% by weight of sorbitol is substituted for the mannitol. The same uniform etching rate is obtained in these two last named runs.

Although the above description refers to etching glass on an aluminum substrate, it is also applicable to other metal substrates which are attacked by hydrofluoric acid.

It is apparent from the foregoing that an etching composition for a glass layer on an aluminum or other metal substrate while preventing attack on the substrate has been provided which is substantially less expensive than the ethylene glycol containing composition for this purpose. This is because of the large amount of ethylene glycol required in comparison to either the surfactant or 6-hydroxy alcohol components of the etch solution in the presence of sodium chloride. In addition, the precipitation problem of the glycol containing etch solution is avoided. Also, the present solution is relatively dilute and so is low in viscosity. This enables the present solution to be readily rinsed off and to etch small openings in photoresist and also conserves the buffered hydrofluoric acid.

What is claimed is:

1. In a method of selectively etching a pyralytic glass layer on a metal substrate without substantially attacking the underlying metal, the step of contacting the glass layer with a dilute aqueous etch solution for a sufficient time to etch through the glass layer, said etch solution comprising buffered hydrofluoric acid, sodium chloride at a concentration from about 1% by weight of solution to the point just below saturation where the sodium chloride begins to precipiate, and a fluorocarbon surfactant capable of forming a thin protective film on the metal substrate, said etch solution being diluted with water.

2. The method of claim 1 in which the metal is aluminum.

3. The method of claim 1 in which said surfactant is present at a concentration no greater than about 1000 parts per million parts of etch solution.

4. In a method of selectively etching a pyralytic glass layer on a metal substrate without substantially attacking the underlying metal, the step of contacting the glass layer with a dilute aqueous etch solution for a sufficient time to etch through the glass layer, said etch solution comprising buffered hydrofluoric acid, sodium chloride at a concentration from about 1% by weight of solution to the point just below saturation where the sodium chloride begins to precipitate, and a 6-hydroxy alcohol, said etch solution being diluted with water.

5. The method of claim 4 in which the 6-hydroxy alcohol is selected from the group consisting of mannitol and sorbitol.

6. The method of claim 4 in which the metal is aluminum.

7. The method of claim 4 in which said 6-hydroxy alcohol is present at a concentration of no greater than about 4% by weight of the etch solution.

* * * * *